(12) United States Patent
Hart et al.

(10) Patent No.: US 9,108,262 B1
(45) Date of Patent: Aug. 18, 2015

(54) DISPOSABLE APPARATUS FOR ALIGNING AND DISPENSING SOLDER COLUMNS IN AN ARRAY

(71) Applicant: TopLine Corporation, Irvine, CA (US)

(72) Inventors: Martin B. Hart, Irvine, CA (US); Roger C. Young, Yorba Linda, CA (US)

(73) Assignee: TOPLINE CORPORATION, Irvine, CA (US)

( * ) Notice: Subject to any disclaimer, the term of this patent is extended or adjusted under 35 U.S.C. 154(b) by 0 days.

(21) Appl. No.: 14/468,180

(22) Filed: Aug. 25, 2014

Related U.S. Application Data

(60) Provisional application No. 61/981,130, filed on Apr. 17, 2014.

(51) Int. Cl.
*B23K 37/00* (2006.01)
*B23K 31/00* (2006.01)
*B23K 3/06* (2006.01)

(52) U.S. Cl.
CPC ........................................ *B23K 3/06* (2013.01)

(58) Field of Classification Search
CPC ................................ B23K 3/06; B23K 3/0607
See application file for complete search history.

(56) References Cited

U.S. PATENT DOCUMENTS

| | | | |
|---|---|---|---|
| 4,664,309 A | 5/1987 | Allen et al. | |
| 4,705,205 A * | 11/1987 | Allen et al. | 228/180.22 |
| 4,712,721 A * | 12/1987 | Noel et al. | 228/56.3 |
| 4,842,184 A * | 6/1989 | Miller, Jr. | 228/180.1 |
| 5,029,748 A * | 7/1991 | Lauterbach et al. | 228/180.1 |
| 5,040,717 A * | 8/1991 | McGaffigan | 228/56.3 |
| 5,497,938 A * | 3/1996 | McMahon et al. | 228/253 |
| 5,626,278 A * | 5/1997 | Tang | 228/56.3 |
| 5,695,109 A * | 12/1997 | Chiang et al. | 228/33 |
| 6,136,128 A * | 10/2000 | Chung | 156/235 |
| 6,276,596 B1 * | 8/2001 | Gruber et al. | 228/225 |
| 6,296,173 B2 * | 10/2001 | Davis et al. | 228/180.22 |
| 6,412,685 B2 * | 7/2002 | Hertz et al. | 228/246 |
| 6,955,285 B2 | 10/2005 | Nomoto et al. | |
| 2014/0262498 A1 | 9/2014 | Hester et al. | |

* cited by examiner

*Primary Examiner* — Devang R Patel
(74) *Attorney, Agent, or Firm* — Knobbe Martens Olson & Bear, LLP

(57) ABSTRACT

A disposable apparatus with a plurality of preloaded pins such as solder columns, micro-coil springs, or other cylindrically shaped metallic parts (solder columns, et al.) in an array pattern is provided for aligning and dispensing onto a column grid array (CGA) substrate. The apparatus is comprised of a carrier plate with a pattern of holes that is covered by a layer of sacrificial adhesive tape with sufficient tackiness to retain, position and hold an array of solder columns, et al. Alignment features on the bottom of the carrier plate plugs into a jig alignment fixture that precisely positions the solder columns, et al. over a CGA substrate. After peeling away the sacrificial adhesive tape from the apparatus, the payload of solder columns, et al. detaches and transfers by gravity onto a pattern of metal pads on the CGA substrate, without the use of vacuum or vibration.

19 Claims, 3 Drawing Sheets

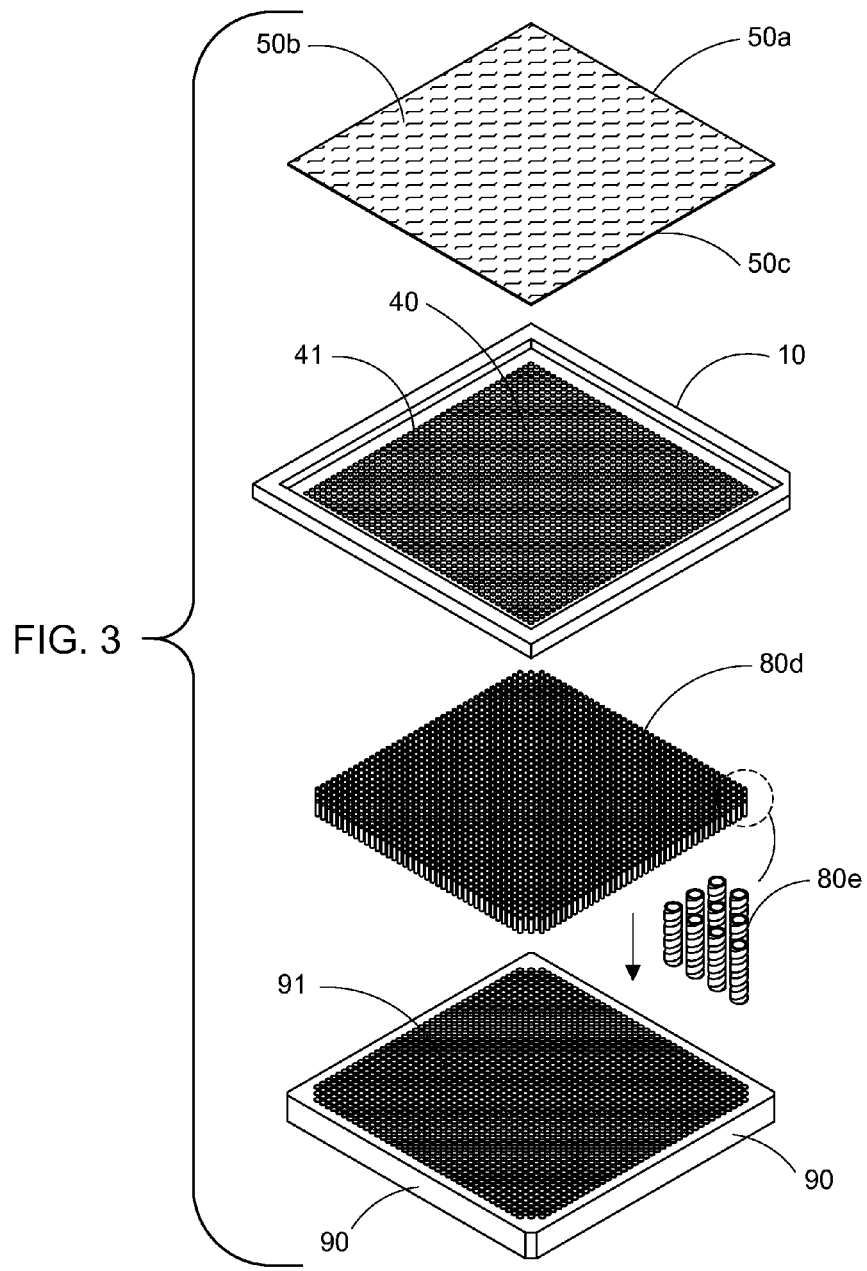

DISPOSABLE APPARATUS FOR ALIGNING AND DISPENSING SOLDER COLUMNS IN AN ARRAY

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

The present application claims priority under 35 U.S.C. 119(e) to U.S. Provisional Patent Application No. 61/981,130 filed Apr. 17, 2014, the entire contents of which are hereby incorporated by reference and should be considered a part of this specification

BACKGROUND

1. Field

The present invention relates generally to column grid array (CGA) semiconductor packaging, and more particularly to an apparatus for aligning and dispensing a plurality of electrical interconnect members, such as pins, solder columns, micro-coil springs, or other cylindrically shaped metallic parts in an array pattern on a ceramic or plastic substrate.

2. Description of the Related Art

Typically, a layer of solder paste is applied to cover an array of conductive pads on a land grid array (LGA) substrate, where the LGA substrate material may consist of ceramic or plastic materials. An intermetallic connection is formed between an array of solder columns and the conductive pads on the LGA after heating and reflowing the solder paste on the LGA. After completion of the reflow process, the LGA with solder columns is known in the art as a column grid array (CGA) or ceramic column grid array (CCGA).

The number of solder columns on the CGA device continues to increase as the density of electronic devices and integrated circuit packages increases. In general, grid array devices have been developed to accommodate the need for integrated circuits with increasing density.

An alternative to CGA column grid array devices is ball grid array (BGA) devices that contain an array of solder spheres (balls) to provide electrical connections between the BGA substrate and the printed circuit board (PCB). In the art, BGA substrates that are constructed of ceramic material (such as alumina or $Al_2O_3$) are known as a ceramic ball grid array (CBGA). Ceramic substrates are often required in harsh environments or when excessive heat and power is present.

However, one problem with BGA devices is that a substantial difference in the coefficient of thermal expansion (CTE) can exist between BGA substrates and the PCB board. The problem with CTE differences becomes more problematic when large size ceramic CBGA substrates are attached to PCB boards that are made of plastic glass-woven material such as FR-4, FR-5 or polyimide. Such differences in the coefficient of thermal expansion causes deformation of the solder spheres (solder balls) interconnecting a ceramic BGA device to a PCB board. Over time, the electrical connection between the solder ball and metal pad will break between large size ceramic BGA substrates and a plastic glass-woven PCB due to CTE mismatching issues.

The problem with CTE mismatch has been addressed by using cylindrical solder columns instead of solder spheres (solder balls) as the electrical interconnect between ceramic substrates and the plastic PCB boards. Taller cylindrically shaped solder columns are generally more compliant to better absorb CTE differential thermal expansion rates between the CGA and the PCB board. Wider solder columns are generally more structurally robust to support the load weight of heavy ceramic substrates. However, the maximum diameter of the solder column is normally constrained by the pitch (spacing) of the conductive pads on the CGA package as well as by the diameter of the conductive pads.

Solder columns are cylindrically shaped and typically have a diameter of approximately 0.51 mm (0.020-inch) and a height of approximately 2.21 mm (0.087-inch). Solder columns may also be as small as 0.20 mm (0.008-inch) in diameter or more than 0.889 mm (0.035-inch) in diameter. Furthermore, the length of solder columns may be as short as 0.25 mm (0.010-inch) or as long as 2.54 mm (0.100-inch) or more.

The conductive pads on the LGA substrate are covered with a controlled thickness of solder paste before attaching a plurality of solder columns, et al. to the LGA substrate. Typically, solder paste consisting of low melting point tin-lead alloy, such as Sn63/Pb37, is preferred for applications within the fields of aerospace, military and defense industries. However, lead free solder paste alloys such as SAC305 (Sn96.5/Ag3.0/Cu0.5), or other Pb-free alloys, may be used for applications requiring lead-free materials.

Solder columns are typically made of high melting temperature solder such as Pb90/Sn10 or Pb80/Sn20. Solder columns may be wrapped with copper ribbon tape as disclosed in U.S. Pat. No. 4,664,309.

An alternative to solder columns is micro-coil springs that are typically made of beryllium copper (Be—Cu) alloy and electroplated with tin-lead solder (Sn60/Pb40) or other plating, as described by National Aeronautics and Space Administration (NASA) under U.S. patent application Ser. No. 13/800,692. NASA has granted an exclusive license to TopLine Corporation to practice the invention described and claimed in U.S. patent application Ser. No. 13/800,692 entitled Interconnect Device and Assemblies Made Therewith.

Solder columns are generally vertically positioned perpendicularly onto a corresponding array of conductive pads on the LGA substrate. The substrate together with high temperature solder columns, et al. and a layer of low temperature solder paste are then heated so that the solder paste is reflowed to make an intermetallic fillet connection between the solder columns and the LGA pads, without melting or damaging the solder columns. The completed package with attached solder columns is known in the art as a column grid array (CGA) or ceramic column grid array (CCGA) package.

A secondary procedure is required to mount the CGA package onto the PCB board. The process of connecting the CGA package to the PCB board requires the CGA to be reflowed again, without melting or collapsing the solder columns. A controlled layer of low temperature melting solder paste is applied to a corresponding plurality of contact pads on the PCB board. The CGA package is placed onto the solder paste covered pads on the PCB board. The PCB board along with one or a plurality of CGA packages (as well as other components) is heated and reflowed resulting in an intermetallic fillet that holds the CGA solder columns to the PCB board.

In the prior art, various methods and apparatuses have been utilized to mount cylindrically shaped solder columns into an array pattern by hand using tweezers or via vibration or with a vacuum pick-up tool.

In the prior art, methods using tweezers to place solder columns by hand are time consuming and require an operator with dexterity to perform many repeated steps. For example, it may require roughly one-hour to load 900 solder columns onto a CGA substrate by hand, assuming that a person using tweezers is able to pick-up, transfer and place one solder column every four seconds. In addition, in the prior art, a person using hand placement methods may result in errors as the operator often fails to complete the specified pattern.

In the prior art, methods using vibration such as described in U.S. Pat. No. 6,955,285 B2 may require an inclined vibration machine with elongated alignment and a vacuum pick-up tool to position solder pins onto a CGA substrate package.

SUMMARY

Accordingly, there is a need for a simpler and more elegant system and method for aligning and dispensing electrical interconnect members (e.g., solder columns) onto LGA, CGA or CCGA substrates without the user of vacuum or vibration.

In accordance with one aspect of the invention, an apparatus and method is provided for aligning and dispensing under the force of gravity electrical interconnect members (e.g., solder columns) onto LGA, CGA or CCGA substrates.

In accordance with another aspect of the invention, an apparatus and method is provided that significantly speeds up the process for dispensing electrical interconnect members (e.g., solder columns, micro-coil springs, etc.) onto LGA, CGA or CCGA substrate packages relative to the time it takes an operator to manually insert solder columns using tweezers onto a ceramic or plastic LGA, CGA or CCGA substrate packages.

In accordance with another aspect of the invention, an apparatus and method is provided that accommodates a variety of different shapes and sizes of interconnect members (e.g., solder columns) without the need to use tweezers, vibration machinery or vacuum pick-up tools.

In accordance with another aspect of the invention, an apparatus and method is provided that minimizes errors caused by an operator incorrectly placing interconnect members (e.g., solder columns) or failing to insert said interconnect member onto a CGA pad that requires one.

In accordance with another aspect of the invention, an apparatus and method is provided that holds, transports and feeds or delivers interconnect members (e.g., solder columns) onto a LGA, CGA or CCGA substrate package that is low cost and dispensable, disposable or recyclable.

In accordance with another aspect of the invention, an apparatus and method is provided comprising a disposable or recyclable plastic plate with a plurality of holes that are loaded with a plurality of electrical interconnect members (e.g., solder columns, micro-coil springs, or other types of cylindrical pins, etc.). The interconnect members (e.g., solder columns, etc.) are held in place in an array pattern by a layer of sacrificial tacky release tape. The interconnect members are protected inside the plurality of holes in the apparatus until released by peeling away the sacrificial tacky release tape. After peeling away the sacrificial tacky tape from the apparatus, the array of interconnect members are transferred by gravity (e.g., dropped) onto a plurality of corresponding pads (e.g., a corresponding pattern of pads) on ceramic or plastic LGA, CGA or CCGA substrates without the use of vacuum or vibration.

In accordance with another aspect of the invention, a system for aligning, dispensing and depositing a plurality of interconnect members onto a column grid array substrate package is provided. The system comprises a body having a peripheral rim and an alignment carrier plate recessed relative to said peripheral rim, the alignment carrier plate having a plurality of holes extending therethrough from a top surface of the plate to a bottom surface of the plate and arranged in a pattern. The system also comprises a cover layer having an adhesive surface in contact with the top surface of the alignment carrier plate such that the layer removably covers the plurality of holes in the alignment carrier plate, said adhesive surface removably attached to an end of a plurality of cylindrically shaped interconnect members releasably disposed in the plurality of holes. The cover layer is manually detachable from the top surface of the alignment carrier plate to release the plurality of interconnect members such that the plurality of interconnect members drop under the force of gravity onto an array pattern of metallic pads of a column grid array substrate without the use of vibration or vacuum. The system also comprises a frame for aligning said carrier plate over said column grid array substrate.

In accordance with another aspect of the invention, an apparatus for aligning, dispensing and depositing a plurality of interconnect members onto a column grid array substrate package is provided. The apparatus comprises a body having a peripheral rim and an alignment carrier plate recessed relative to said peripheral rim. The alignment carrier plate has a plurality of holes extending therethrough from a top surface of the plate to a bottom surface of the plate and arranged in a pattern. The top surface of the alignment carrier plate is removably coverable with a cover layer having an adhesive surface such that the cover layer removably covers the plurality of holes in the alignment carrier plate. Said adhesive surface is removably attached to an end of a plurality of cylindrically shaped interconnect members releasably disposed in the plurality of holes. The cover layer is manually detachable from the top surface of the alignment carrier plate to release the plurality of interconnect members such that the plurality of interconnect members drop under the force of gravity from the alignment carrier plate.

These and other objects, features and advantages of the present invention will become more apparent from the detailed description of the preferred embodiment when read in conjunction with the drawings.

BRIEF DESCRIPTION OF THE DRAWINGS

FIG. 3 is an exploded view of the apparatus of FIG. 1A with the adhesive layer, alignment plate with a plurality of holes, an array of interconnect members dropping via gravity feed onto a CCGA substrate with a plurality of metalized pads to receive the interconnect members.

DETAILED DESCRIPTION

Figure 1A:
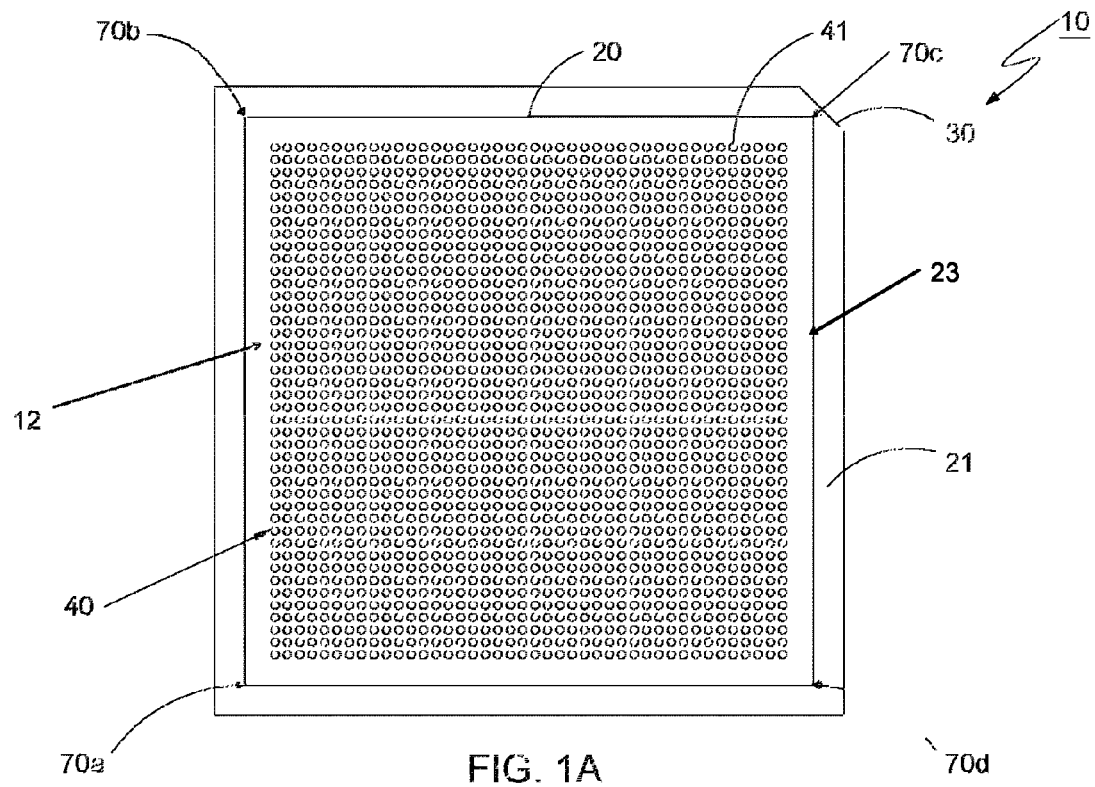
FIG. 1A is a top view and FIG. 1B is a perspective view of one embodiment of an apparatus with an array of holes that house, position and align a plurality of interconnect members prior to placement onto a CCGA substrate.
Figure 1B:
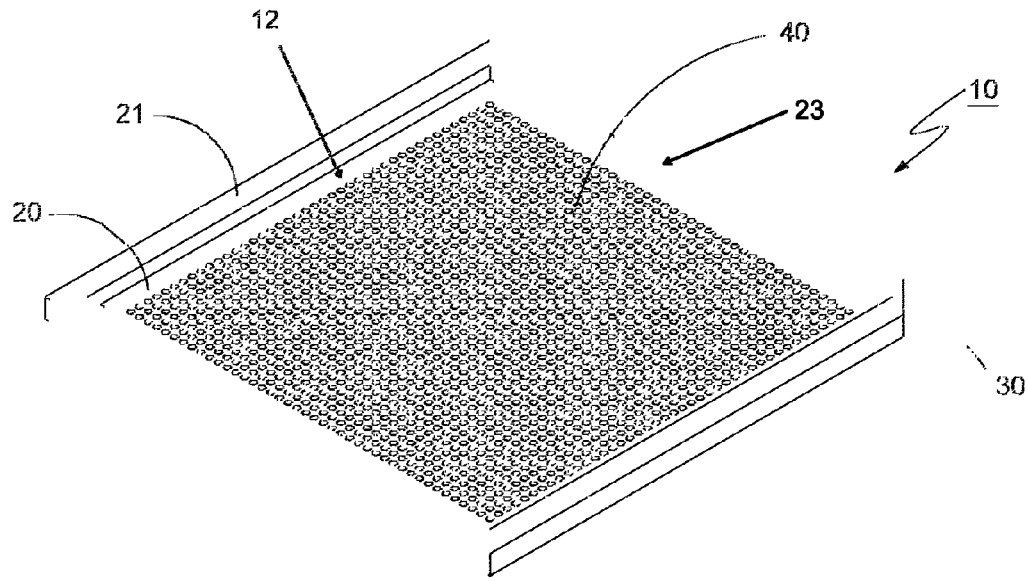
Figure 2A:
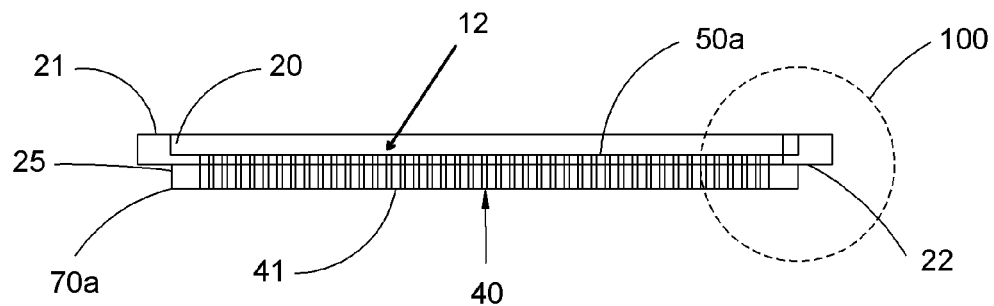
FIG. 2A is an isometric side view of the apparatus of FIG. 1A.
Figure 2B:
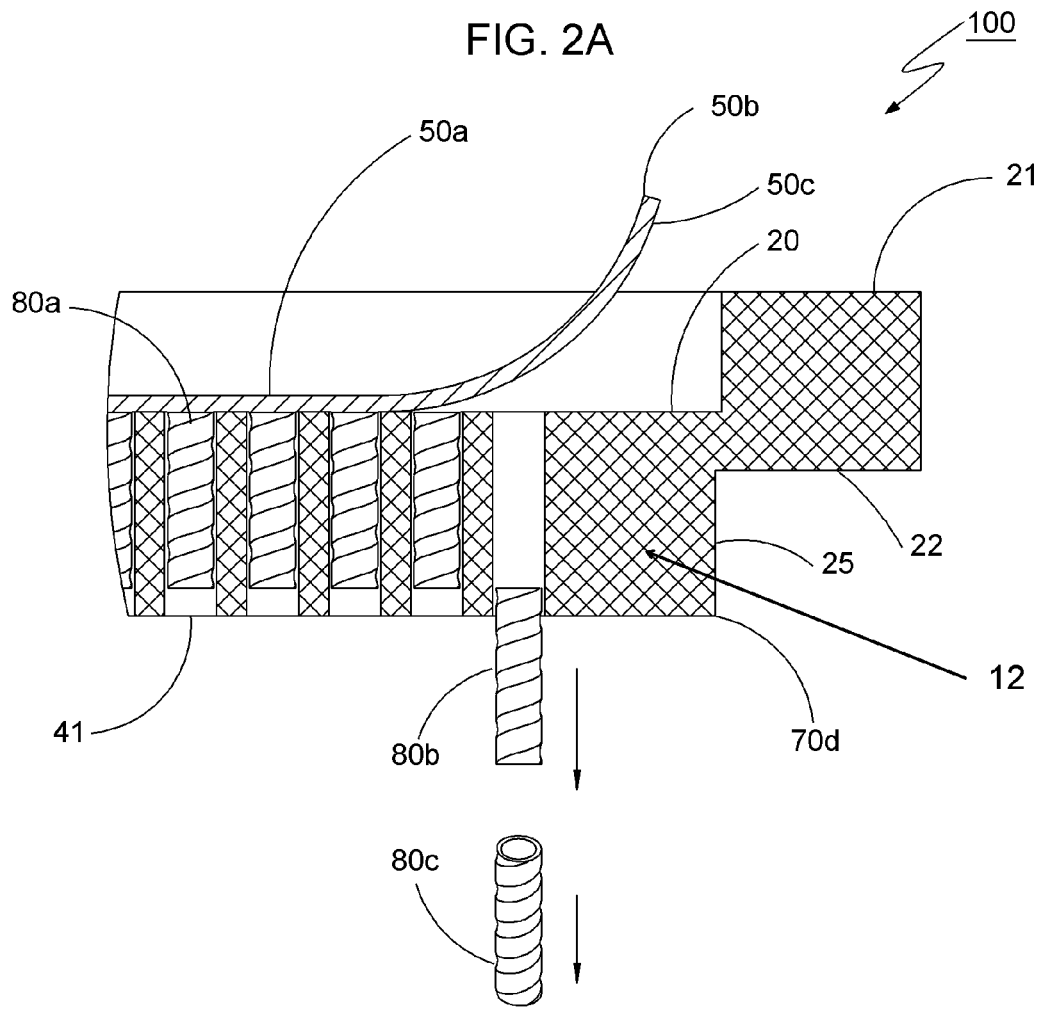
FIG. 2B is an enlarged cross sectional side view of the apparatus of FIG. 1A showing details of a plurality of interconnect members (e.g., solder columns) attached to an adhesive layer as well as an interconnect member dropping via gravity feed after peeling away the adhesive layer.

Referring first to FIGS. 1A and 1B, is an apparatus, shown for clarity without the adhesive layer (e.g., of sacrificial tacky tape) 50a in FIG. 2B and FIG. 3, generally designated at 10, that can hold, align and dispense one or more (e.g., a plurality of) electrical interconnect members 80 in any desired array pattern. The apparatus 10 can be shaped like a tray with a plurality (e.g., an array) of holes 40 that extend through a plate portion 12 of the tray 10. The one or more electrical interconnect members 80 can be solder columns, micro-coil springs, pins or other suitable generally cylindrical members that are releasably disposed in the holes 40 of the apparatus 10, as discussed further below.

FIGS. 2A, 2B and FIG. 3 show the adhesive layer 50*a* that is removably coupled to the apparatus 10. The bottom side 50*c* of the adhesive layer (e.g., sacrificial tape) 50*a* is advantageously sufficiently tacky to hold and releasably adhere to one end of the one or more (e.g., a plurality of) electrical interconnect members 80, as shown in FIG. 2B, while the one or more electrical interconnect members 80 are positioned in one or more holes 40 of the apparatus 10. The top side 50*b* of the adhesive layer (e.g., sacrificial tape) 50*a* in FIG. 2B and FIG. 3 is not tacky and serves as a non-adhesive liner.

The one or more interconnect members 80 can be arranged in an array 80*d* shown in FIG. 3. The one or more interconnect members 80 can drop and fall from the apparatus 10 via (e.g., solely under the force of) gravity after the adhesive layer (e.g., sacrificial tacky tape) 50*a* is peeled away from a planar surface 20 of the plate portion 12 of the tray or apparatus 10 as shown in FIG. 2B. The adhesive layer 50*a* can be manually peeled away from said planar surface 20, such as using finger nails or with another suitable mechanism. The underside 50*c* of the adhesive layer (e.g., sacrificial tacky tape) 50*a* adheres to the planar surface 20 of apparatus 10 until it is peeled away.

As the adhesive layer (e.g., sacrificial tacky tape) 50*a* is peeled from the planar surface of 20, the one or more interconnect members (e.g., solder columns) 80*a* detach from the adhesive layer and hit the side walls of the holes 41 creating sufficient force to cause the solder column 80*b* to drop via gravity without the use of vacuum or vibration. Interconnect member 80*c* is a solder column shown in FIG. 2B in a perspective view outside of the tray of the apparatus 10. The array pattern of interconnect members (e.g., solder columns) 80*d* is shown dropping onto a pattern of corresponding metallic pads 91 on a top surface of a CCGA substrate 90 in FIG. 3.

As shown in FIGS. 1A, 1B, 2A and FIG. 3, a pattern array of holes 40 may be arranged in any desired pattern such as an even number matrix (example 2×2 or more than 42×42) or in an odd number matrix (example 3×3 or more than 41×41). The center-line of the tray apparatus 10 intersects between the array of pattern holes 40 of an even numbered array (e.g., between rows of holes 40 in an even numbered array). The center-line of the tray apparatus 10 intersects through the array pattern of holes 40 of an odd numbered array (e.g., intersects a row of holes 40 in an odd numbered array).

The array pattern of holes 40 can include a plurality of holes 41 formed in the apparatus 10, which can include a disposable or recyclable alignment plate through which the plurality of holes 41 extend. The plurality of holes 41 can be arranged in any desired array pattern 40 for removably housing a plurality of interconnect members 80, such as solder columns. The four corners 70*a*, 70*b*, 70*c* and 70*d* in FIG. 1A as well as four side walls 25 in FIG. 2A and FIG. 2B form the perimeter boundary of an alignment feature on the underside of tray apparatus 10.

In operation, the CCGA substrate 90 with the corresponding array pattern of pads 91 is held in alignment to the array of interconnect members (e.g., solder columns) 80*d* with a graphite (or other material) jig-fixture. The underside of apparatus 10 plugs into a socket opening in the jig-fixture. The socket aperture on the graphite jig-fixture is slightly larger than the alignment feature on the underside of apparatus 10. The four ledges 22 in FIGS. 2A and 2B on the underside of apparatus 10 rest on top of the jig-fixture. Once aligned, the adhesive layer 50*a* can be peeled off, as discussed above, allowing the one or more interconnect members 80 to detach from the adhesive layer and fall under the force of gravity onto the CCGA substrate 90 such that the one or more interconnect members 80 contact corresponding array pattern of pads 91.

The inside perimeter aperture 23 of a frame 21 of the apparatus 10 is slightly larger than the underside perimeter of side walls 25 of the apparatus 10, thus advantageously allowing a plurality of apparatuses 10 to be nested and stacked one-into the other during transport.

As shown in FIGS. 1A-1B, one corner 30 of apparatus 10 is chamfered (e.g., at 45-degrees) to provide a visual orientation and alignment with the CCGA substrate 90.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A system for aligning, dispensing and depositing a plurality of interconnect members onto a column grid array substrate package, comprising:

a body having a peripheral frame and an alignment carrier plate portion recessed relative to a top surface of said peripheral frame and bounded by an inner sidewall of said peripheral frame, the alignment carrier plate portion having a plurality of holes extending therethrough from a to surface of the alignment carrier plate portion to a bottom surface of the alignment carrier plate portion and arranged in a matrix array; and a cover layer having an adhesive surface in contact with the top surface of the alignment carrier plate portion such that the cover layer removably covers the plurality of holes in the alignment carrier plate portion, said adhesive surface removably attached to ends of a plurality of cylindrically shaped interconnect members releasably disposed in the plurality of holes, said holes having a larger diameter than a diameter of the interconnect members, the cover layer manually detachable from the top surface of the alignment carrier plate portion to release the plurality of interconnect members such that the plurality of interconnect members drop through the holes under the force of gravity onto an array pattern of metallic pads of a column grid array substrate without the use of vibration or vacuum.

2. The system of claim 1, wherein said alignment carrier plate portion is square or rectangular.

3. The system of claim 1, wherein said body comprises a material chosen from a group consisting of plastic, ceramic, graphite and metal materials.

4. The system of claim 1, wherein a thickness of said alignment carrier plate portion between the top surface and the bottom surface is greater than a length of the cylindrically shaped interconnect members contained within the plurality of holes.

5. The system of claim 1, wherein the adhesive surface has an adhesive force of sufficient strength to hold and retain said interconnect members in the plurality of holes while the adhesive surface is in contact with the top surface of the alignment carrier plate portion.

6. The system of claim 1, wherein the plurality of cylindrically shaped interconnect members are solder columns.

7. The system of claim 1, wherein an air gap surrounds the cylindrically shaped interconnect members within the holes of said alignment carrier plate portion.

8. The system of claim 1, wherein the sidewalls of the holes in said alignment carrier plate portion surround the interconnect members and protect said interconnect members while said interconnect members are retained and attached to the adhesive surface of the cover layer.

9. The system of claim 1, wherein the sidewalls of the holes in said alignment carrier plate portion limit the swaying motion and angle of movement of the cylindrically shaped interconnect members while said interconnect members are attached to the adhesive surface of the cover layer.

10. The system of claim 1, wherein the cylindrical sidewalls of the holes in the alignment carrier plate portion define a chute to align, position and guide said interconnect members to drop under the force of gravity onto the substrate.

11. An apparatus for aligning, dispensing and depositing a plurality of interconnect members onto column grid array substrate package, comprising:

a body having a peripheral rim and an alignment carrier plate portion recessed relative to a top surface of said peripheral rim and bounded by an inner sidewall of the peripheral rim, the alignment carrier plate portion having a plurality of holes extending therethrough from a top surface of the alignment carrier plate portion to a bottom surface of the alignment carrier plate portion and arranged in a matrix array on an area of the alignment carrier plate portion, the to surface of the alignment carrier plate portion having a removable cover layer having an adhesive surface such that the cover layer removably covers the plurality of holes in the alignment carrier plate portion, said adhesive surface removably coupleable to ends of a plurality of cylindrically shaped interconnect members releasably disposed in the plurality of holes, the cover layer manually detachable from the top surface of the alignment carrier plate portion to release the plurality of interconnect members such that the plurality of interconnect members drop through the holes under the force of gravity from the alignment carrier plate portion.

12. The apparatus of claim 11, wherein the plurality of interconnect members drop under the force of gravity onto an array pattern of metallic pads of a column grid array substrate without the use of vibration or vacuum.

13. The apparatus of claim 11, wherein said alignment carrier plate portion is square or rectangular.

14. The apparatus of claim 11, wherein said body comprises a material chosen from a group consisting of plastic, ceramic, graphite and metal materials.

15. The apparatus of claim 11, wherein said plurality of holes have a larger diameter than the cylindrically shaped interconnect members contained within the holes.

16. The apparatus of claim 11, wherein a thickness of said alignment carrier plate portion between the top surface and the bottom surface is greater than a length of the cylindrically shaped interconnect members contained within the plurality of holes.

17. The apparatus of claim 11, wherein the peripheral rim has an outer sidewall with a larger peripheral dimension than a peripheral dimension of an outer sidewall of the recessed alignment carrier plate portion such that an outer surface of the body is stepped so that the body is stackable, where said peripheral dimension of the outer sidewall is smaller than a peripheral dimension of the inner sidewall of the peripheral rim.

18. The apparatus of claim 11, wherein cylindrical sidewalls of the holes in the alignment carrier plate portion define a chute to align, position and guide said interconnect members to drop under the force of gravity onto the substrate.

19. The apparatus of claim 12, wherein the peripheral rim comprises a chamfered corner that provides a visual orientation and alignment feature for aligning the body with the column grid array substrate.

* * * * *

UNITED STATES PATENT AND TRADEMARK OFFICE
CERTIFICATE OF CORRECTION

PATENT NO. : 9,108,262 B1
APPLICATION NO. : 14/468180
DATED : August 18, 2015
INVENTOR(S) : Martin B. Hart et al.

Page 1 of 1

It is certified that error appears in the above-identified patent and that said Letters Patent is hereby corrected as shown below:

In the claims,

At column 7, line 65, in Claim 1, please delete "to surface" and insert -- top surface --, therefor.

At column 8, line 59, in Claim 11, please delete "to surface" and insert -- top surface --, therefor.

Signed and Sealed this
Thirty-first Day of May, 2016

Michelle K. Lee
*Director of the United States Patent and Trademark Office*